(12) United States Patent
Pylant et al.

(10) Patent No.: US 7,950,116 B2
(45) Date of Patent: May 31, 2011

(54) CANTILEVERED TRAY CLIP WITH APERTURE

(75) Inventors: James D. Pylant, Temecula, CA (US); Scott C. Bradley, Carlsbad, CA (US); Alan Waber, Wildomar, CA (US)

(73) Assignee: Peak Plastic & Metal Products (Int'l) Ltd., Hong Kong (HK)

( * ) Notice: Subject to any disclaimer, the term of this patent is extended or adjusted under 35 U.S.C. 154(b) by 1191 days.

(21) Appl. No.: 11/485,081

(22) Filed: Jul. 12, 2006

(65) Prior Publication Data

US 2006/0248692 A1    Nov. 9, 2006

Related U.S. Application Data

(62) Division of application No. 10/620,282, filed on Jul. 14, 2003, now abandoned.

(51) Int. Cl.
*A44B 21/00* (2006.01)
*B65D 67/02* (2006.01)
*B65D 85/86* (2006.01)

(52) U.S. Cl. ........ 24/570; 206/307.1; 206/710; 206/449; 206/451; 211/126.1

(58) Field of Classification Search ........................ None
See application file for complete search history.

(56) References Cited

U.S. PATENT DOCUMENTS

| | | | |
|---|---|---|---|
| 2,171,350 A | 8/1939 | Anderson | 24/563 |
| 2,211,879 A | 8/1940 | Cave | 281/45 |
| 2,467,604 A | 4/1949 | Tinnerman et al. | 24/563 |
| 4,326,653 A | 4/1982 | Stone | 224/312 |
| 4,505,395 A | 3/1985 | Nathan | 206/504 |
| 5,461,541 A | 10/1995 | Wentland et al. | 24/570 |
| 5,659,612 A | 8/1997 | Wang | 379/446 |
| 5,970,586 A | 10/1999 | Demel et al. | 24/563 |
| 5,983,468 A | 11/1999 | Evans, III et al. | 24/457 |
| 6,229,706 B1 | 5/2001 | Cook et al. | 361/719 |
| 6,283,291 B1 | 9/2001 | Vasudeva et al. | 206/373 |

FOREIGN PATENT DOCUMENTS

| | | |
|---|---|---|
| JP | 51-140472 | 12/1976 |
| JP | 59-51763 | 4/1984 |
| JP | 05-338682 | 12/1993 |
| JP | 2000-25831 | 1/2000 |
| JP | 2000025831 | 1/2000 |

*Primary Examiner* — Jack W. Lavinder
(74) *Attorney, Agent, or Firm* — Isabelle R. McAndrews (57) ABSTRACT

A cantilevered clip is provided for holding a stack of at least one tray and tray cover. Stack compressive forces applied by the clip are substantially limited to tray and cover edge portions. The clip has a channel base with left and right side walls attached for restricting movement of a stack in left and right directions. Pressure members are positioned orthogonal to at least one wall. An aperture is located adjacent to each pressure member and partially extends into each wall. Protrusions above the base extend inward towards the walls of the channel for captivating the stack in an upward direction.

23 Claims, 8 Drawing Sheets

SECTION A-A

FIG. 12

CANTILEVERED TRAY CLIP WITH APERTURE

This application is a divisional of Ser. No. 10/620,282 filed Jul. 14, 2003, now abandoned which is assigned to the Assignee of the present application. This application is also related to U.S. Pat. No. 6,877,194 entitled "Open Frame Tray Clip" filed on Jul. 14, 2003, which is expressly incorporated by reference herein.

BACKGROUND OF THE INVENTION

1. Field of the Invention

This invention relates generally to apparatus for securing trays that are used in storing or transporting components such as semiconductors, and more particularly to a clip for securing a tray and cover or stack of trays and a cover that places stack compression forces on tray perimeter rails in order to minimize tray distortion caused by clip forces.

2. Description of the Prior Art

Figure 1:
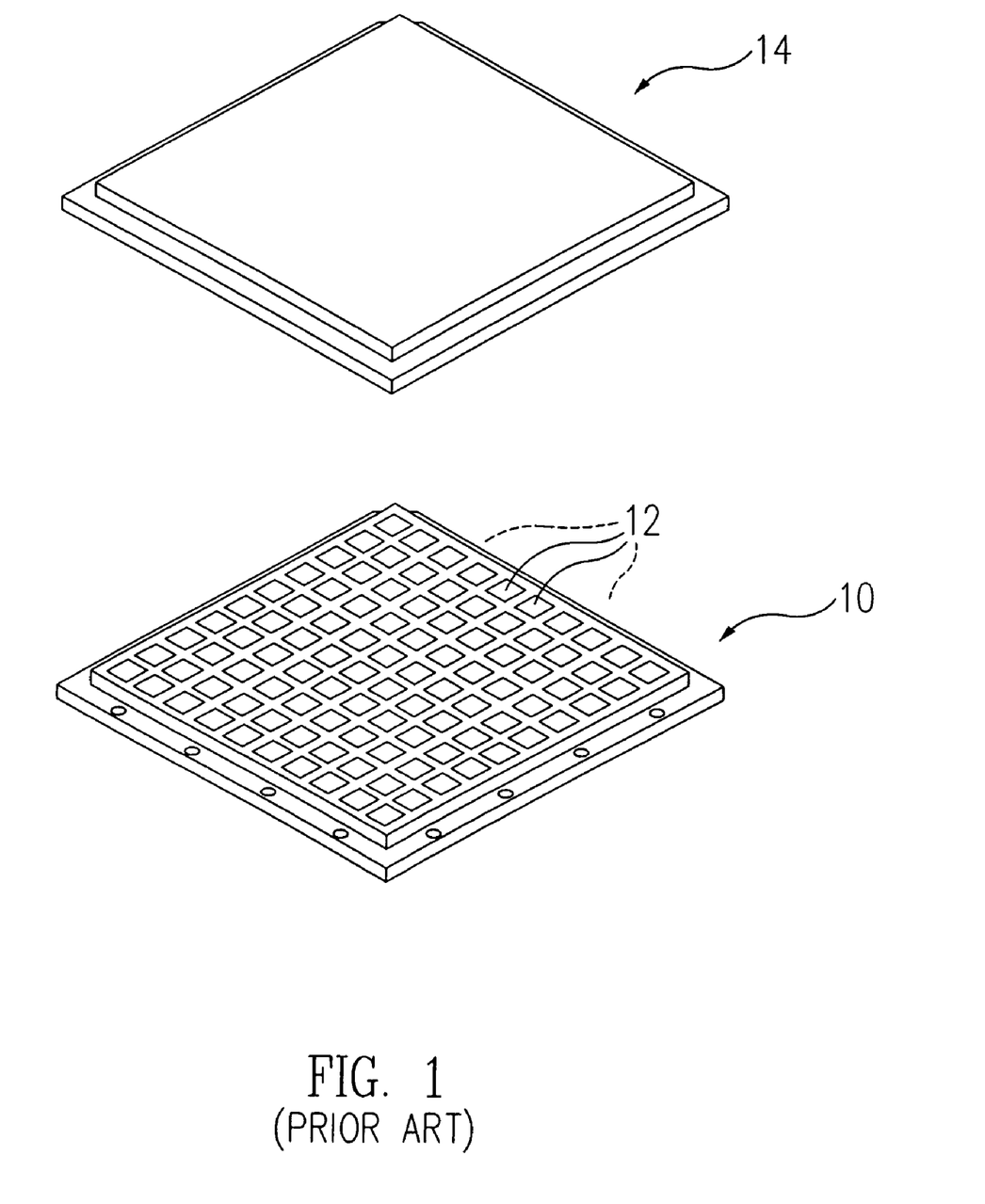
FIG. 1 shows a prior art tray and cover.
Figure 2:
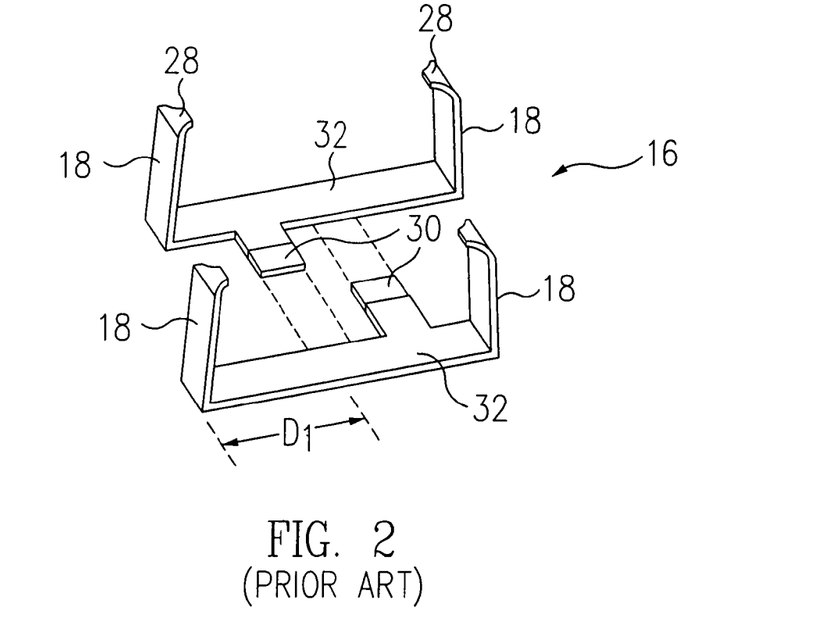
FIG. 2 illustrates a prior art two piece clip.
Figure 3:
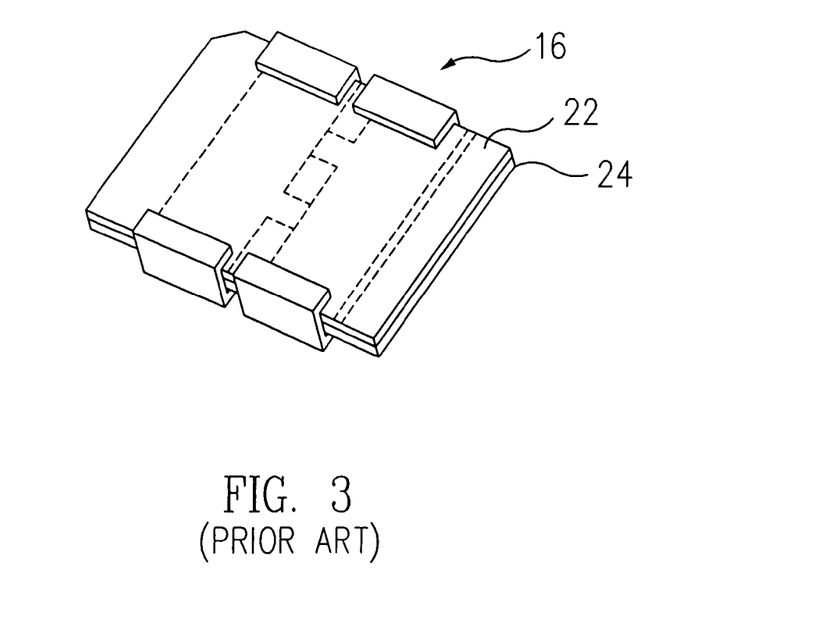
FIG. 3 illustrates a clip of the type shown in FIG. 2 holding a stack.
Figure 4:
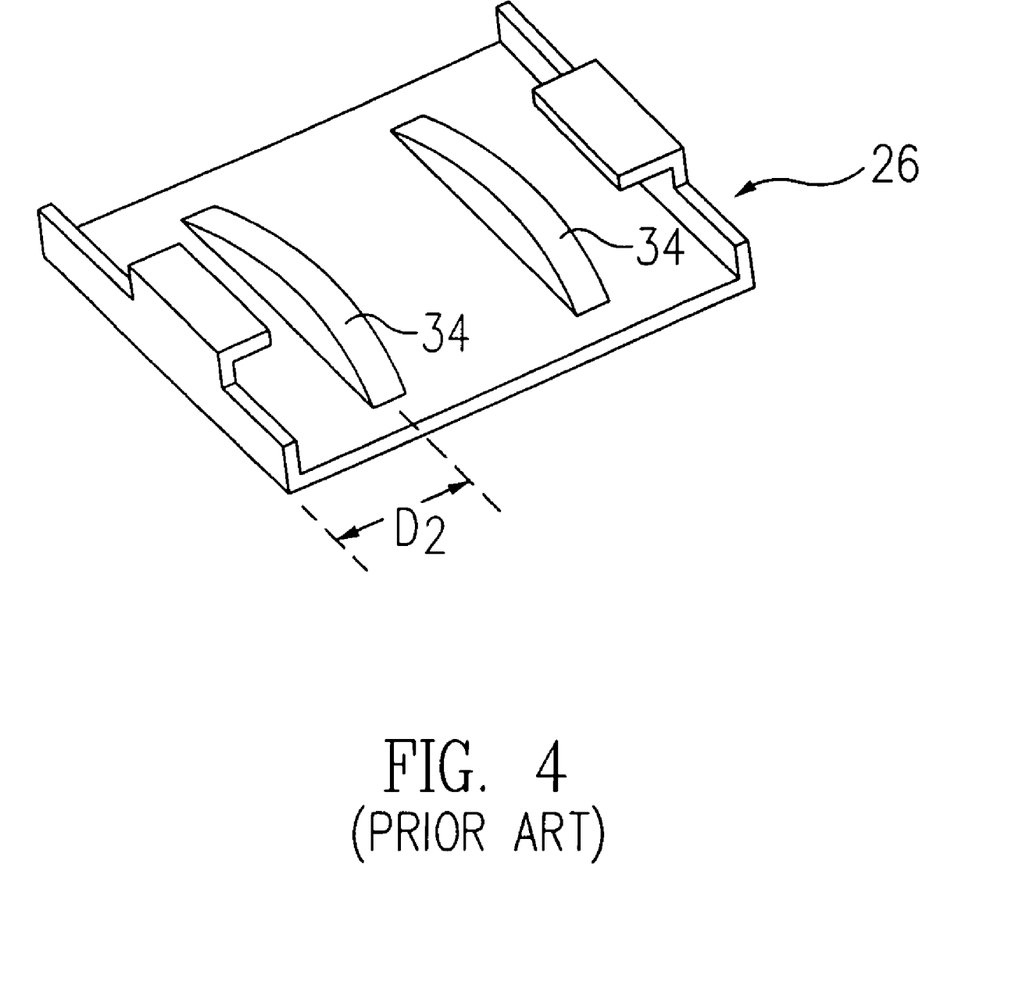
FIG. 4 shows a prior art clip having two centrally located springs for applying stack pressure.

Small components such as semiconductors are often stored or shipped in molded plastic trays such as tray 10 shown in FIG. 1. With the components (not shown) in pockets 12, a cover such as cover 14 is placed over the tray 10 for captivating the components in the pockets 12. It is then often necessary to apply a device to secure the top 14 to the tray 10. For example, FIG. 2 illustrates a two part clip apparatus 16 used to clamp a tray and cover together, or a stack of trays and a cover together. The height of leg 18 is designed to accommodate the height of the stack. FIG. 3 illustrates the use of a two part clip apparatus 20 for securing a cover 22 to a tray 24. FIG. 4 illustrates another type of tray clip 26.

In order for the stack of trays to be secure, the clip provides a compressive force to the stack. Prior art designs apply force to a central area of the bottom of the stack, which eventually causes permanent damage to the trays. Prongs such as 28 (FIG. 2) are used at the stack top, with the opposing force in the central area of the bottom of the stack. In FIG. 2, each of the extensions 30 slide under the corresponding mating part and provide an interference, causing the base 32 to bend in a manner that results in the clip applying a spring force when the clips are installed on a stack.

FIG. 4 shows another clip apparatus 26 with two leaf springs 34 for application of force to a stack inserted in the clip 26. The designs of FIGS. 2-4 apply a leverage to the tray, operating between each of the top prong contact points and the corresponding area of contact on the central area of the bottom of the stack. The leverage applied to the tray by the spring force is proportional to the distances roughly indicated for example by dimensions $D_1$ and $D_2$ resulting in application of a bending force to the trays. This force causes damage due to the application of the force in the thin and weak central area. As the trays warp over time, gaps are produced between trays in a stack. In some cases, the components stored in a tray can fall through the gaps, or be pinched in a gap, causing damage to the component. In addition, when a stack of trays is removed from a clip, and a tray is presented to an automated pick and place machine, the warped, distorted tray can cause pick-up errors. The problem of warped trays is augmented in situations when trays are recycled i.e. re-used after having been used in a stack and become warped. For example, if a used warped tray is placed in a stack with a new tray or new cover, significant gaps are possible, causing tray components to fall out.

SUMMARY

It is an advantage of this invention in that it provides an improved clip for securing a stack of trays that minimizes warp due to tray clip forces.

It is a further advantage of this invention in that it provides a clip for securing a stack of trays that confines the retaining forces to the tray edges and therefore minimizes leverage to the stack and reduces tray warpage.

In one embodiment of the present invention, a clip is provided for holding a stack of at least one tray and tray cover. The clip has a channel structure providing a channel, and having first and second restraining segments positioned on opposing sides of the channel. The segments are attached to a channel base. The restraining segments and base restrict lateral and vertical movement of a stack of trays placed in the channel. At least one pressure member is provided that applies a vertically directed pressure component on a perimeter portion of the stack, forcing the stack into contact with an opposing portion of the channel structure. Stack compressive forces applied by the clip are substantially limited to tray and cover perimeter rail portions. In a particular embodiment, the clip has a channel base with left and right side retaining walls attached for restricting movement of a stack in left and right directions. Left and right side protrusions above the base extend inward towards the center of the channel from the left and right side walls respectively for captivating the stack in an upward direction. The pressure members include resilient protrusions extending upward from the base on input and output ends of the channel that are configured for applying an upward spring force on corresponding bottom edge portions of the stack.

DESCRIPTION OF THE PREFERRED EMBODIMENTS

Figure 5:
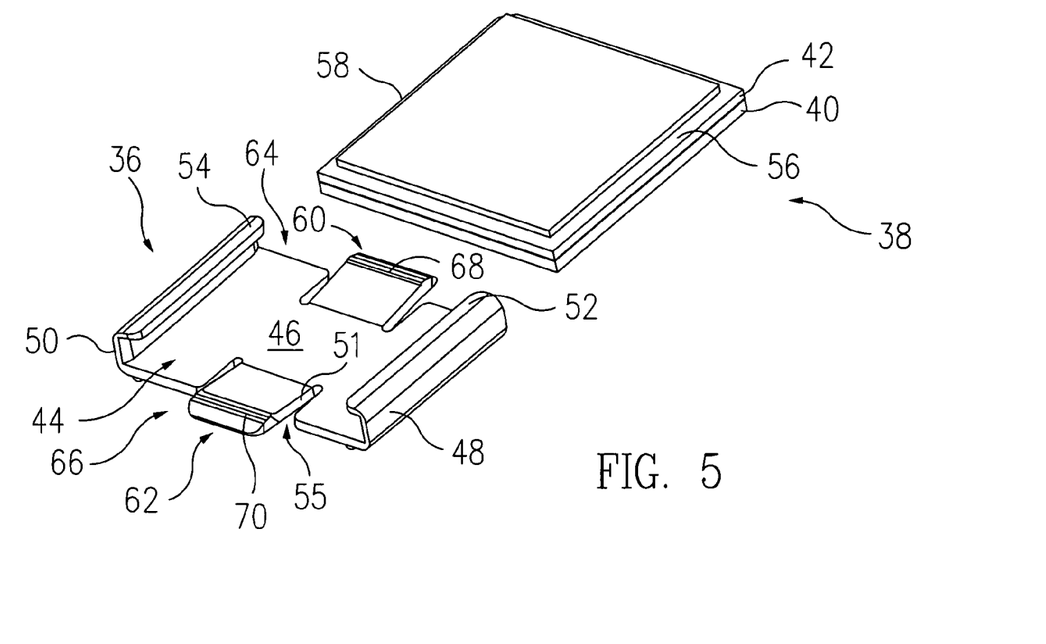
FIG. 5 is a perspective view of a clip according to the present invention, and a representative tray with cover in a position for installation in the clip.

Referring now to FIG. 5 of the drawings, a particular embodiment of the present invention is shown in the form of a clip 36 for holding a stack, such as stack 38 including a tray 40 and cover 42. The clip 36 forms a channel structure providing a channel 44. The structure includes a clip base 46, and has first and second restraining segments 48 and 50 that can be of various forms, illustrated in FIG. 5 as vertically oriented walls providing left and right captivation of a stack. The restraining segments and base restrict lateral and vertical movement of a stack of trays placed in the channel. Vertical captivation of a stack in the particular embodiment of FIG. 5 is provided in the upward direction by right side and left side protrusions 52 and 54, positioned above a channel base 46, and inwardly directed towards a central area of the channel 44 from left and right side restraining segments 48 and 50 respectively. The protrusions 52 and 54 are positioned above the base 46 so as to lie above the right and left side edges 56 and 58 of a stack 38 positioned in the channel 44 of the clip 36.

According to the present invention, a pressure member is provided that applies a vertically directed pressure component on a perimeter portion of the stack, forcing the stack into contact with an opposing portion of the channel structure. The pressure members in the particular embodiment of FIG. 5 are shown as first and second resilient members 60 and 62 extending from base 46 at first and second opposing ends 64 and 66 of channel 44. Each pressure member 60, 62 has a slit 55 between base 46 and side 51. FIG. 5 also shows pressure members 60 and 62 with resilient members extending in an upward direction from base 46.

Figure 6:
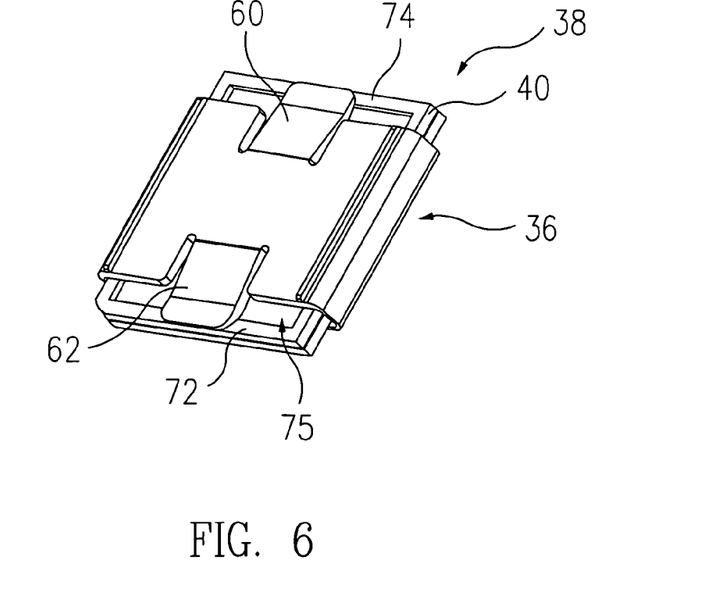
FIG. 6 is a bottom perspective view of the clip of FIG. 5 with a stack installed.

FIG. 6 provides a bottom view of the clip 36 of FIG. 5 with stack 38 inserted in channel 44. Resilient members 60, 62 of clip 36 are shown with contact areas 68 and 70 applying an upward force on edge portions 72 and 74 (hereinafter referred to as edges) on the bottom of stack 38. Edges 72 and 74 are also known as perimeter portions that surround the bottom cavity 75 of tray 40. FIG. 6 clearly shows resilient members 60 and 62 deflected by edges 72 and 74 of tray 40. When resilient members apply a force on edges 72 and 74, stack 38 comes into contact with protrusions 52 and 54, thereby captivating the stack in the clip 36.

Figure 7:
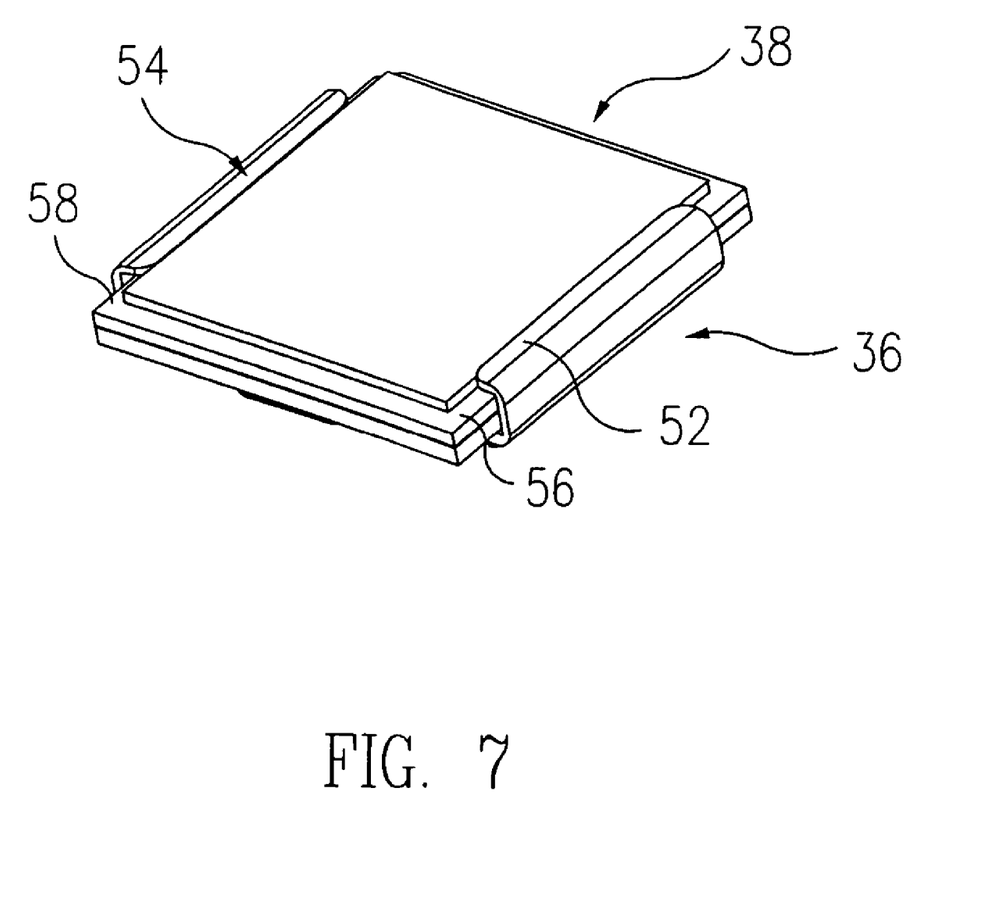
FIG. 7 is a top perspective view of the assembly of FIG. 6.

FIG. 7 is a top perspective view of the assembly of FIG. 6, showing protrusions 52 and 54 of clip 36 extending over the edge portions 56 and 58 of stack 38.

Figure 8:
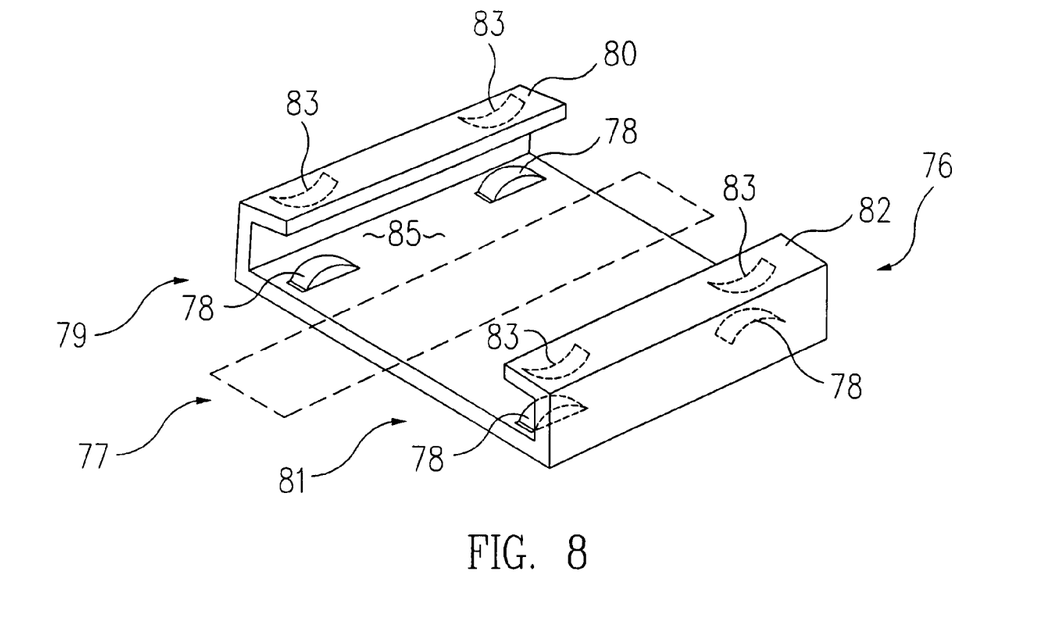
FIG. 8 illustrates a tray with springs for applying a force to the left and right edge areas of a stack.

The above-described embodiment is given by way of example. The present invention substantially restricts the application of force by a clip to perimeter areas near edges 72 and 74 of the trays. Various alternate embodiments will be apparent to those skilled in the art upon reading the present disclosure, and these alternate embodiments are included in the spirit of the present invention. For example, instead of the single leaf type members 60, 62 as shown in FIGS. 5-7, other configurations could be used, including a plurality of members on either or both of the input and/or output of channel 44. For example, FIG. 8 shows a clip 76 with springs 78 positioned under the protrusions 80 and 82 for applying a spring force substantially at the perimeter side rail areas of a tray according to the spirit of the present invention. A simple elongated spring of various designs could alternatively be used on each side instead of the two springs 78 per side. In FIG. 8, springs 78 as shown, are positioned/configured for pressuring a stack of trays against the under side of protrusions 80 and 82. As an alternate embodiment, springs 83 in FIG. 8, similar to springs 78, can be alternatively positioned and attached to the protrusions 80 and 82 for pressuring perimeter portions of a stack of trays, forcing the stack against the base 85. As a still further embodiment of the present invention, an apparatus is provided in a plurality of parts, wherein each part provides a clamping action on a perimeter portion of a stack. For example, referring again to FIG. 8, if the portion designated by dashed lines 77 were removed, the result would be two parts 79 and 81 which could be used to restrain a stack in a similar way as described above in describing the clip 76.

Figure 9:
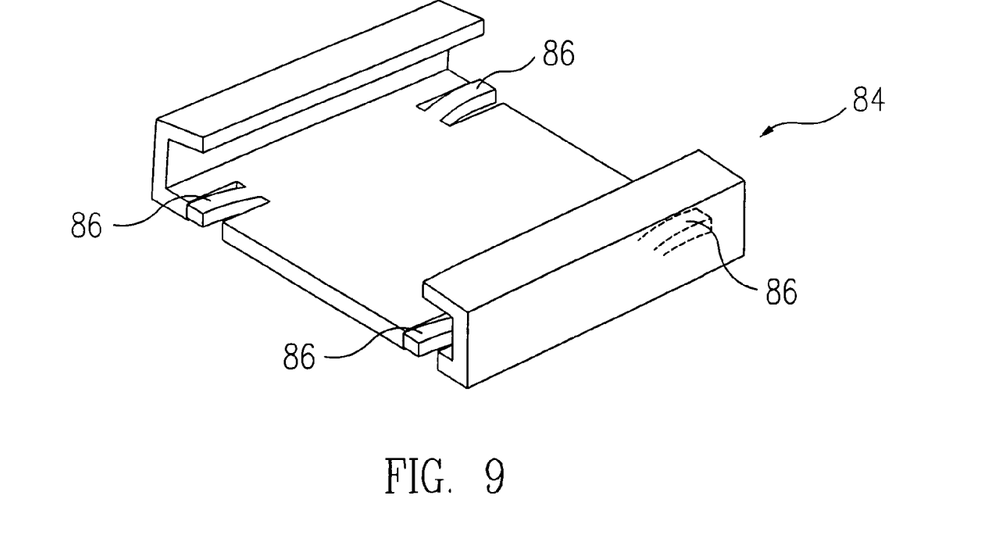
FIG. 9 illustrates an alternate clip design for applying force to right and left tray edge portions.

FIG. 9 shows a further alternate embodiment of a clip 84 wherein resilient members 86 are shown having an integral, molded design similar to the members 60 and 62 of FIGS. 5-7, but smaller and placed near the right and left tray edges, instead of making contact under the front and back tray edge areas as in FIGS. 5-7.

Figure 10:
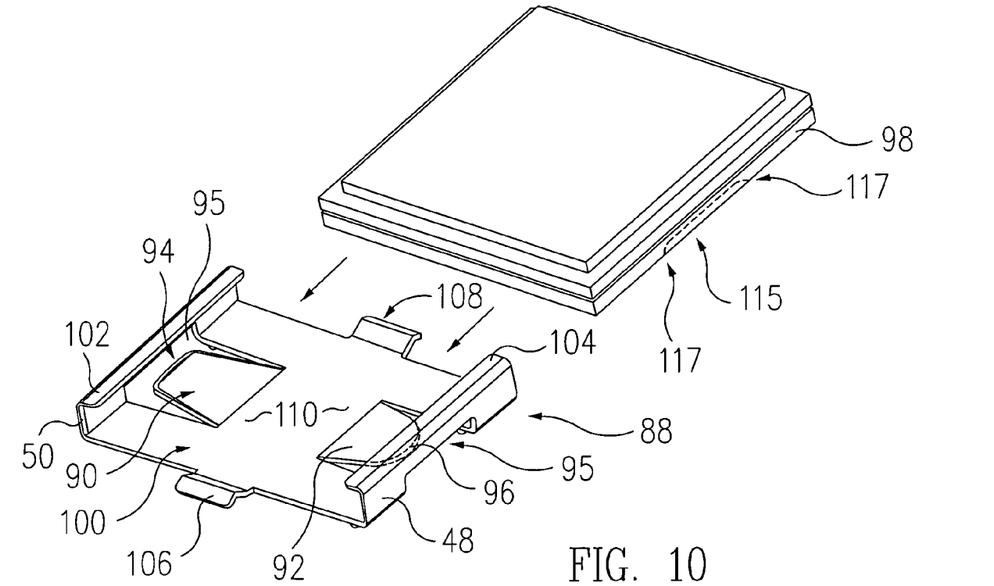
FIG. 10 illustrates an alternate embodiment of the clip invention wherein pressure members are provided on a longitudinal axis orthogonal to the walls of the clip.
Figure 11:
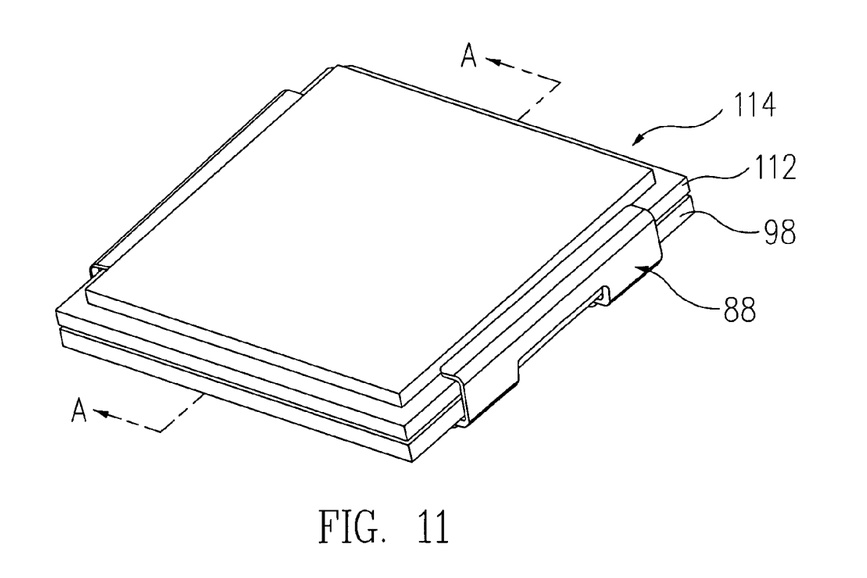
FIG. 11 illustrates a stack installed in the clip of FIG. 10.

A further alternate embodiment of a clip 88 according to the present invention is illustrated in FIG. 10. As in prior embodiments of the invention, channel structure 100 in FIG. 10 is formed by restraining segments 48 and 50 being attached to the base. Pressure members, in the form of resilient leaf members 90 and 92, are shown positioned so as to bring leaf surfaces 94 and 96 into contact with edge portions of a tray 98 when inserted into channel 100. In this embodiment, pressure members are located on a longitudinal axis orthogonal to a wall of channel structure 100. Each pressure member, 90 and 92, is a cantilever such that the proximal end is attached to base 110. Whereas, the distal end 94, 96 of each pressure member applies a force to the stack. In addition, an aperture 95 adjacent each pressure member 90, 92 is located on a region of restraining segments 48, 50. Aperture 95 may also include an area of base 110. Accordingly, the resilient members 90, 92 form a portion of base 110 and are located opposite one another. Leaf surfaces 94 and 96 are positioned below protrusions 102 and 104. As a further alternate embodiment, clip 88 can additionally include flexible retainers 106 and 108 that extend upward from base 110 for assisting in securing a stack in the clip. FIG. 11 shows a stack 114 including the tray 98 and cover 112 installed in clip 88.

Figure 12:
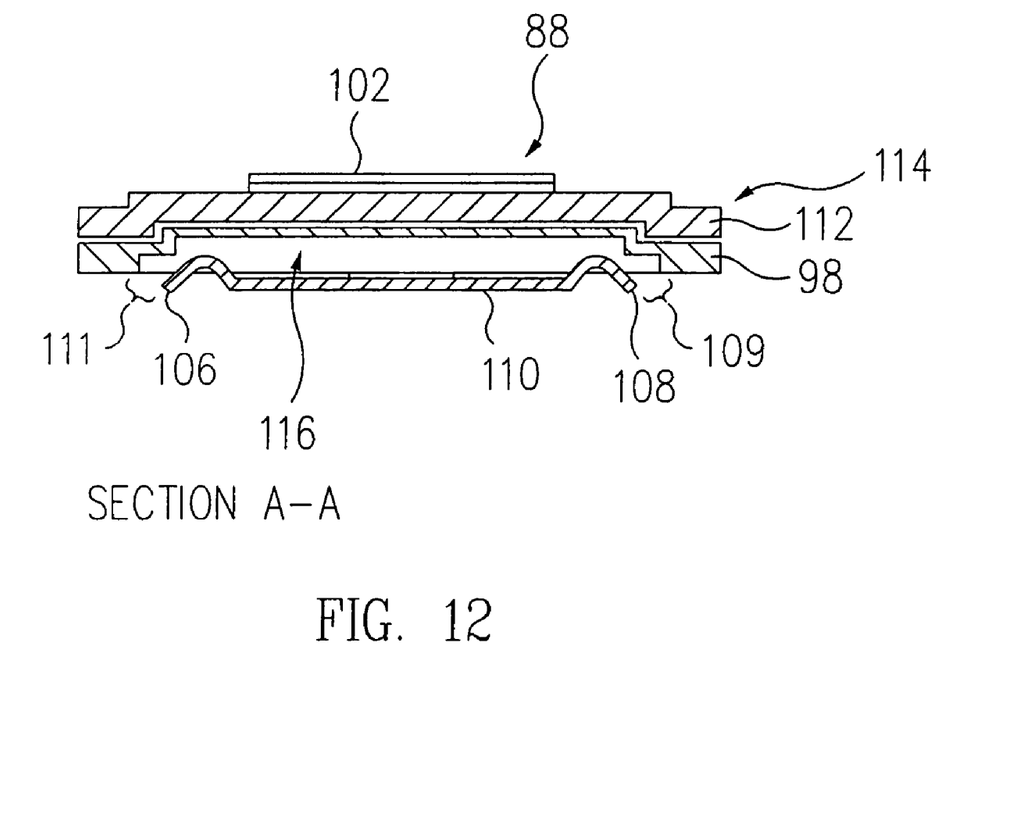
FIG. 12 is a cross-sectional view of the clip illustrated in FIG. 11, showing the position of the retainers.

FIG. 12 is a cross section A-A from FIG. 11 showing the positions of the retainers 106 and 108 that protrude into the tray bottom cavity 116 to provide added resistances to movement of the stack 114 for retaining the stack 114 in the clip 88. FIG. 12 shows gaps 109 and 111 between the ends of the retainers 106 and 108 that extend from clip base 110. FIG. 12 also illustrates cover 112 between protrusions 102 and tray 98. The present invention includes any size gap, including no gap i.e. an interference fit that would more strictly prevent tray movement. The function of retainers 106 and 108 can be accomplished with other structures that will be apparent to those skilled in the art upon reading the present disclosure. In addition to other retaining structures built into the clip, a cut-out such as shown by dotted lines 115 in the tray 98 of FIG. 10 can be included, into which the leaf 92 would reside upon insertion of the tray 98 in the clip 88. The tapered edges 117 would allow tray 98 to be forced out of the clip, while providing sufficient resistance to retain the stack under normal forces of handling and other anticipated forces.

Although the designs of FIGS. 5-7 and 9-12 are described as a single molded piece, the present invention applies also to clips constructed forming a plurality of separate parts. Also, various types of materials can be used to fabricate the clip. For example, the present invention applies to a clip apparatus with pressure members that are separately manufactured parts. The clip body can also be constructed with two or more parts, such as a separate clip for each of two ends of a stack that restrict the forces to tray perimeter/edge areas.

The preferred embodiments as described above, and variations that will be apparent to those skilled in the art, limit the application of pressure to the trays to the perimeter area. As a further alternative embodiment, pressure can additionally be applied to non-perimeter areas.

While the present invention has been described herein with reference to particular embodiments thereof, a latitude of modifications, various changes and substitutions are intended in the foregoing disclosure, and it will be appreciated that in some instances some features of the invention will be employed without a corresponding use of other features without departing from the spirit and scope of the invention as set forth in the appended claims.

The invention claimed is:

1. An apparatus for clamping together in a stack at least one tray and one cover, the apparatus comprising:
   a base forming a bottom of a channel, the channel having a first opening opposite a second opening, each opening allowing for the insertion and removal of the stack, wherein the stack has a horizontal boundary and a vertical boundary;
   first and second restraining segments attached to the base that together with the base form a channel structure;
   a protrusion that extends inward from each restraining segment; and
   at least two pressure members attached to the channel structure, wherein the pressure members are located on a longitudinal axis orthogonal to at least one of the restraining segments of the channel structure.

2. The apparatus of claim 1, wherein the stack is clamped together between the protrusions and the two pressure members, and the two pressure members apply pressure to the stack.

3. The apparatus of claim 2, wherein the pressure members apply a force on a portion of the perimeter of the stack to clamp the stack together.

4. The apparatus of claim 3, wherein a force is additionally applied to a non-perimeter area of the stack.

5. The apparatus of claim 1, further comprising a retainer that extends upward from the base.

6. The apparatus of claim 1, wherein the protrusion attached to each wall above the base that extends inwards over part of the vertical boundary on the edge portion of the stack when the stack is inserted in the channel and another part of the vertical boundary is not covered by said protrusion.

7. The apparatus of claim 1, further comprising an aperture adjacent each of said pressure members.

8. The apparatus of claim 7, wherein each pressure member is located below said protrusion.

9. An apparatus for holding a stack of at least one tray and a cover, the apparatus comprising:
   a base;
   first and second restraining segments attached to the base that together with the base form a channel structure; and
   at least two pressure members attached to the channel structure, wherein an aperture is located adjacent to each pressure member, and partially extends into each of the first and second restraining segments.

10. The apparatus of claim 9, wherein said aperture further includes an area of the base.

11. The apparatus of claim 9, wherein the two pressure members apply pressure to a portion of the perimeter of the stack.

12. The apparatus of claim 9, wherein the two pressure members are located on a longitudinal axis orthogonal to a wall of the channel structure.

13. The apparatus of claim 9, further comprising flexible retainers attached to the base to assist in securing a stack within the apparatus.

14. An apparatus for holding a stack of at least one tray and one cover, the apparatus comprising:
   a base;
   a first and a second wall;
   a channel whose boundaries are defined by the first and the second wall;
   a plurality of pressure members located within the channel boundaries, each of said plurality of pressure members being positioned orthogonal to at least one of said first and second wall, wherein the pressure members apply a force that is confined to a portion of the edges of the stack.

15. The apparatus of claim 14, further comprising a protrusion on each wall that cooperates with the plurality of pressure members to hold the stack in place.

16. The apparatus of claim 14, wherein an aperture is located adjacent to each pressure member, and partially extends into each of the first and second walls.

17. The apparatus of claim 14, wherein each of said plurality of pressure members has a proximal end attached to the base and a distal end, wherein the distal end applies a force to the stack.

18. The apparatus of claim 17, wherein the force applied by the distal end of each pressure member is applied to an edge portion of the stack.

19. The apparatus of claim 17, wherein each pressure member is a cantilever.

20. The apparatus of claim 14, further comprising a retainer that extends upward from the base.

21. The apparatus of claim 20, wherein said retainer occupies a space within a cavity of the tray when the tray is inserted into the channel.

22. An apparatus for holding a stack of at least one tray and one cover, the apparatus comprising:
   a base;
   a first and a second wall attached to the base to form a channel structure;
   a plurality of pressure members attached to the channel structure, wherein the plurality of pressure members are located on a longitudinal axis orthogonal to a wall of the channel structure; and
   an aperture, said aperture being located adjacent to each pressure member, and partially extending into each of the first and second walls, wherein each pressure member is a cantilever having a proximal end attached to the base and a distal end, wherein the distal end applies a force to an edge portion of the stack.

23. The apparatus of claim 22, further comprising a retainer that extends upward from the base.

* * * * *